(12) United States Patent
Kawashima

(10) Patent No.: US 6,255,844 B1
(45) Date of Patent: Jul. 3, 2001

(54) SEMICONDUCTOR TESTING APPARATUS

(75) Inventor: Hidemi Kawashima, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/489,246

(22) Filed: Jan. 21, 2000

(30) Foreign Application Priority Data

Jan. 29, 1999 (JP) ................................. 11-023168

(51) Int. Cl.[7] .................................................. G01R 31/26
(52) U.S. Cl. ...................................... 324/765; 324/158.1
(58) Field of Search .................................. 324/765, 759, 324/763, 158.1, 73.1; 702/119, 118, 117; 7143/700, 731, 724, 736, 739

(56) References Cited

U.S. PATENT DOCUMENTS

| | | | |
|---|---|---|---|
| 4,928,278 | * | 5/1990 | Otsuji et al. ........................... 714/700 |
| 5,390,129 | * | 2/1995 | Rhodes .............................. 324/158.1 |
| 5,579,251 | * | 11/1996 | Sato ..................................... 702/117 |
| 5,794,175 | * | 8/1998 | Conner ................................ 702/119 |

* cited by examiner

Primary Examiner—Ernest Karlsen
Assistant Examiner—Minh Tang
(74) Attorney, Agent, or Firm—Fish & Richardson P.C.

(57) ABSTRACT

A semiconductor testing apparatus capable of simultaneously testing a plurality of devices 3 to be tested to which a plurality of testing circuit blocks are allotted, respectively, comprising an arithmetic circuit 6 for receiving all outputs from the plurality of testing circuit blocks to compute the decision results from the plurality of devices.

8 Claims, 3 Drawing Sheets

SEMICONDUCTOR TESTING APPARATUS

BACKGROUND OF THE INVENTION

The present invention relates to a semiconductor testing device, and particularly to decision of PASS/FALL of a device to be tested.

FIG. 2 is a block diagram of a circuit for deciding PASS/FALL of a device to be tested in a semiconductor testing apparatus according to a prior art.

The input terminal of a driver 1 and the input terminal of a comparator 2 are connected to a device to be tested. When a testing signal is supplied to the device, the driver 1 sends an input signal to the device. When a tested signal is taken out from the device, the output from the device is supplied to the comparator 2. The output from the comparator 2 is supplied to a PASS/FAIL deciding circuit 4. The output from the PASS/FAIL deciding circuit 4 is supplied to an OR or AND circuit 5. The OR or AND circuit 5 produces a FAIL output.

There are provided a plurality of drivers 1, comparators 2 and PASS/FAIL deciding circuits 4 according to the number of terminals of the device. The output from each PASS/FAIL deciding circuit is supplied to the OR or AND circuit 5.

A testing circuit block having such a structure is individually provided for each device to be tested.

However, when the device 3 is tested by the semiconductor testing apparatus thus structured, the following problem occurs. Namely, if the device to be tested has input/output terminals whose number exceeds that of terminals of the testing circuit block, the device cannot be tested.

In this case, as shown in FIG. 3, if there is an unused testing circuit block (testing circuit block corresponding to DUTn), it can be used for testing. However, two testing circuit blocks are used to test a single device so that the number of the devices 3 to be simultaneously tested must be reduced to ½.

SUMMARY OF THE INVENTION

The present invention has been accomplished in order to solve the above problem, and intends to provide a semiconductor testing apparatus which can minimize the reduction in the number of the devices to be simultaneously tested even if the number of the input/output terminals of the device to be tested exceeds that of the terminals of the testing circuit block in the semiconductor testing apparatus.

The invention defined in Aspect 1 is a semiconductor testing apparatus capable of simultaneously testing a plurality of devices to be tested to which a plurality of testing circuit blocks are allotted, respectively, comprising an arithmetic circuit for receiving all outputs from the plurality of testing circuit blocks to compute the decision results from the plurality of devices.

The invention defined in Aspect 2 is a semiconductor testing apparatus according to aspect 1, wherein the arithmetic circuit classifies outputs from the plurality of testing circuit blocks according to the devices to be tested and takes an OR and AND thereof.

The invention defined in Aspect 3 is a semiconductor testing apparatus according to aspect 1 or 2, wherein the testing circuit block comprises: a comparator for comparing an output from the device to be tested with a reference value, and a PASS/FAIL deciding circuit for deciding PASS/FAIL of the output from the device to be tested on the basis of the comparison result from the comparator.

DETAILED DESCRIPTION OF THE PREFERRED EMBODIMENTS

Figure 1:
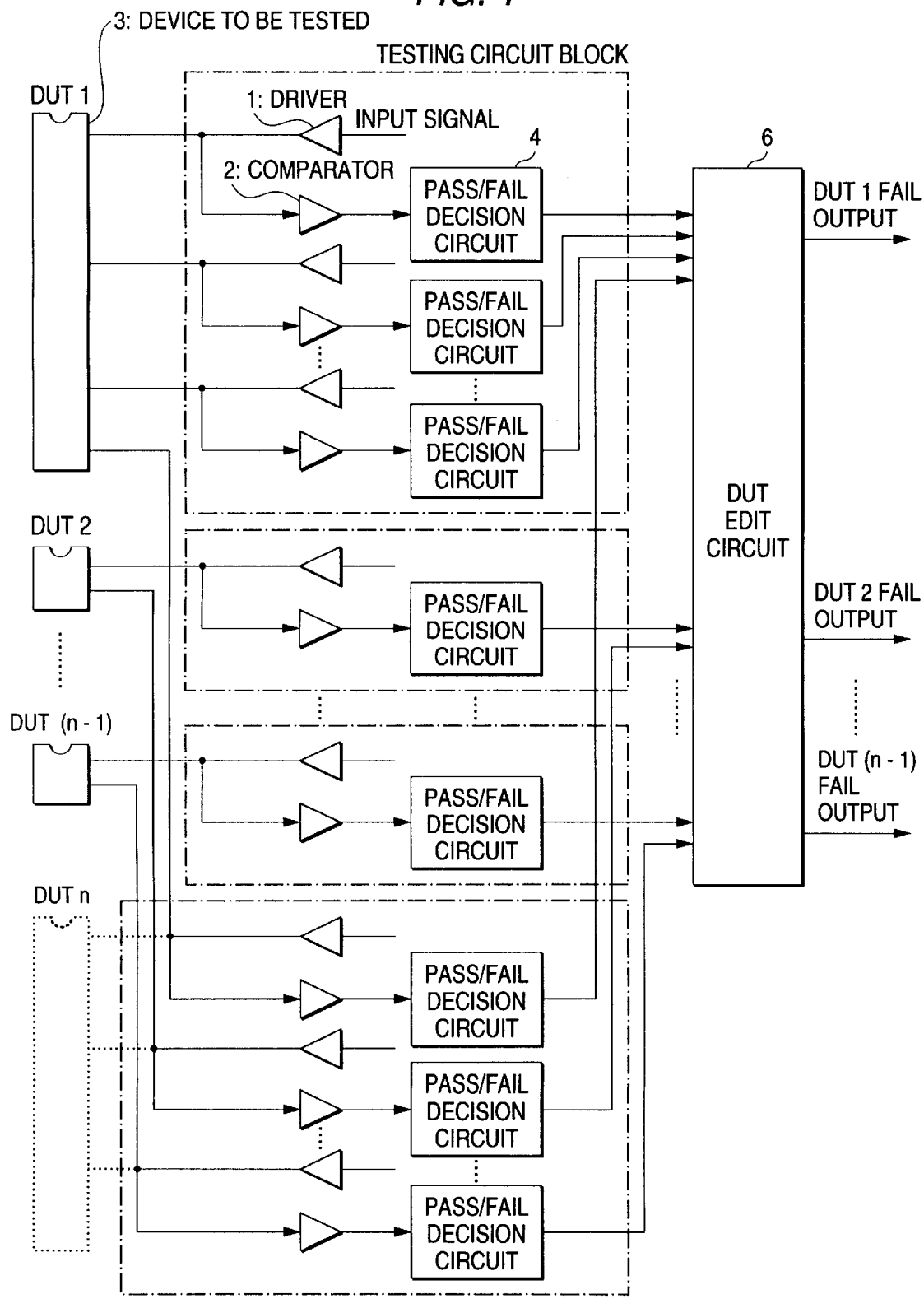
FIG. 1 is a block diagram showing the arrangement of a semiconductor testing apparatus according to an embodiment of the present invention.
Figure 2:
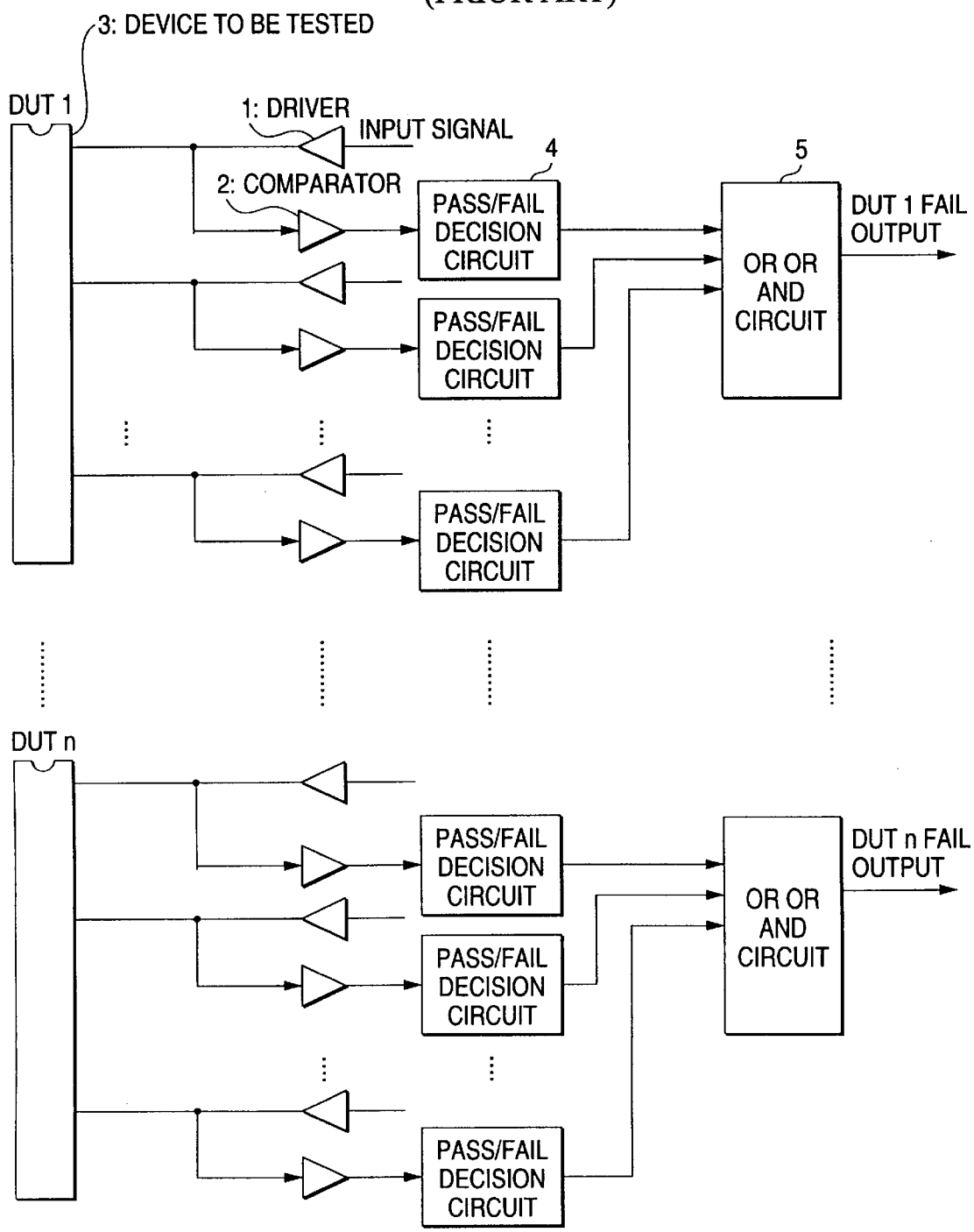
FIG. 2 is a block diagram showing the arrangement of a conventional semiconductor testing apparatus.
Figure 3:
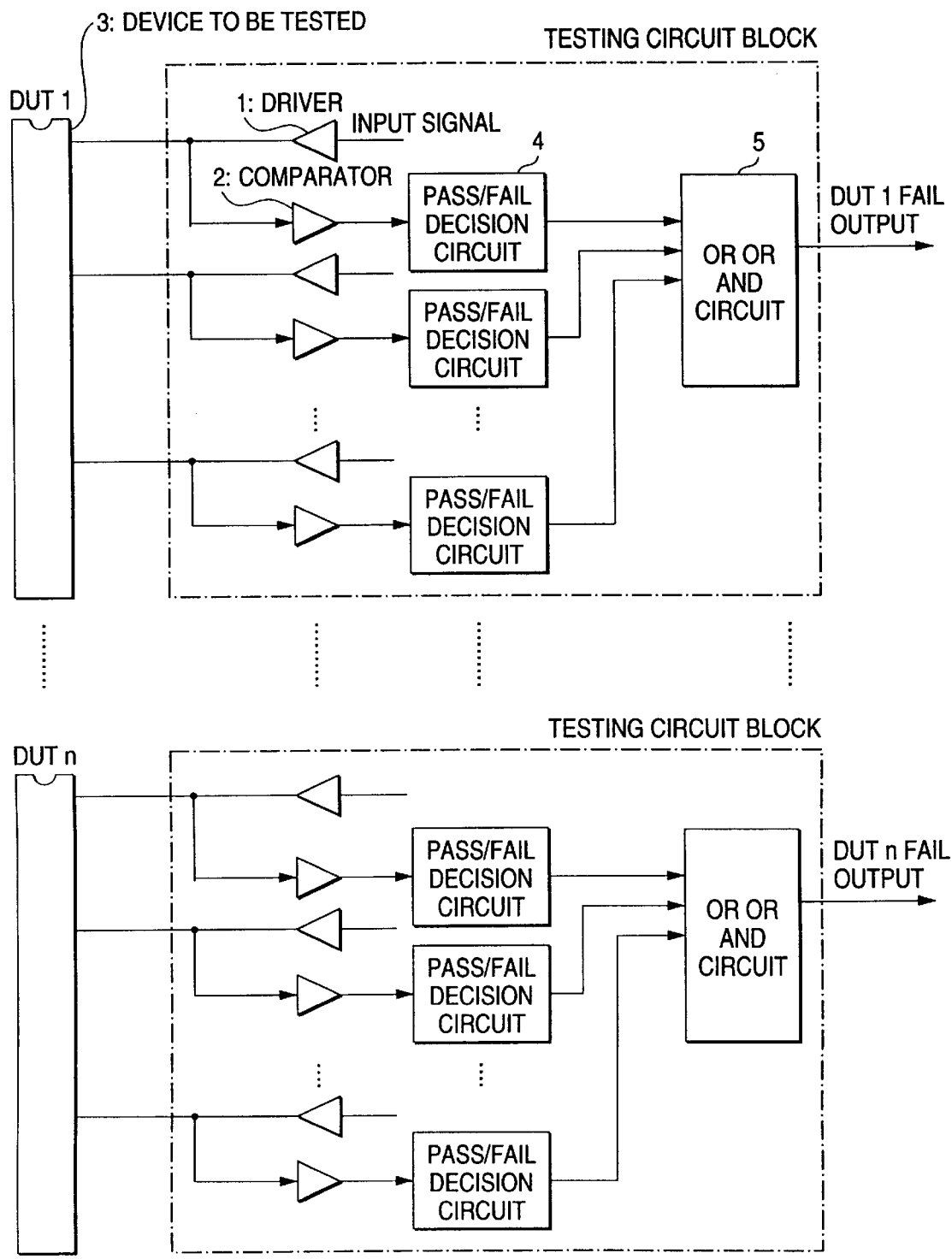
FIG. 3 is a block diagram showing the state where a device to be tested DUTn (n: integer) is not present of a plurality of devices to be tested in the conventional semiconductor testing apparatus.

Referring to a block diagram of FIG. 1, an explanation will be given of an embodiment of the present invention. A single terminal of the device 3 to be tested is connected to a single output terminal of a driver 1 for receiving an input signal and a single input terminal of a comparator 2. The output from the comparator 2 is supplied to a PASS/FAIL deciding circuit 4. The output from the PASS/FAIL deciding circuit 4 is supplied to an DUT EDIT circuit 6.

There are provided a plurality of drivers 1, comparators 2 and PASS/FAIL deciding circuits 4 to constitute a single testing circuit block. The testing circuit block essentially corresponds to the single device to be tested. A combination of the driver 1, comparator 2 and PASS/FAIL deciding circuit 4 corresponds to a single terminal of the device to be tested.

In this embodiment, since the number of terminals of the device to be tested is larger by one than that of the terminals of the testing circuit block, the redundant one terminal of the device to be tested is connected to an unused testing circuit block (testing circuit block corresponding to DUT(n)). The redundant terminals of all the devices to be tested, i.e. DUT (1), DUT (2), . . . DUT (n-1) are connected to the unused testing circuit block (testing circuit block corresponding to DUT(n)).

The DUT EDIT circuit 6 produces FAIL outputs corresponding to the respective devices to be tested, i.e. FAIL oputput of DUT (1), FAIL output of DUT (2), . . . FAIL output of DUT (n).

The operation of this embodiment will be explained below. When a testing signal is supplied to the device to be tested, an input signal is supplied to the input terminal of the device 3 to be tested through the driver 1. When a tested signal is taken out from the device, the output signal from the device is supplied to the comparator 2. This output signal is compared with a reference signal in the comparator. The comparison result from the comparator 2 is supplied to a PASS/FAIL deciding circuit 4. On the basis of the comparison result, the PASS/FAIL deciding circuit 4 decides whether the output signal from the device to be tested is normal or not.

The decision result (PASS/FAIL information) is supplied to the DUT EDIT circuit 6. As occasion demands, OR or AND of the plurality of decision results (PASS/FAIL result information) is taken. The DUT EDIT circuit 6 produces the FAIL result which is a decision result of a single device to be tested, e.g. a DUT (1) FAIL output.

In this case, the output signal from the redundant terminal of the device to be tested is supplied to the testing circuit block corresponding to DUT (n). This output signal is supplied to the comparator. The comparison result is supplied to the PASS/FAIL deciding circuit. The output from the PASS/FAIL deciding circuit is also supplied to the DUT/ EDIT circuit 6. In DUT/EDIT circuit 6, this output is OR-ed or AND-ed together with the above plurality of decision results (PASS/FALL information) Thus, the decision result for the single device to be tested is computed.

As described above, in this embodiment, unlike the prior art, the DUT EDIT circuit 6 is not provided for each of the testing circuit blocks, but only one is provided for all the testing circuit blocks. Therefore, the outputs from the different testing circuit blocks can be synthesized to compute the decision result of the single device to be detected.

The DUT EDIT circuit 6 individually deals with each of the plurality of testing circuit blocks. Therefore, even if the plurality of outputs from the testing circuit block corresponding to the DUT (n) are a collection from the outputs from the devices 3 to be tested, they can be classified for each device to be tested. The classified output can be synthesized with the outputs from the testing the testing circuit block to which mist of the outputs from each device 3 to be tested are supplied, thereby computing the decision result of each device to be tested.

The DUT EDIT 6 may be constructed in hardware, and may be configured by a computer which is controlled by software.

In accordance with the present invention, even if the number of the input/output terminals of the device to be tested exceeds that of the terminals of the testing circuit block in the semiconductor testing apparatus, the reduction in the number of the devices to be simultaneously tested can be minimized.

What is claimed is:

1. A semiconductor testing apparatus comprising:

a plurality of testing circuits each of which can be coupled to a predetermined maximum number of terminals of a different respective one of a plurality of devices under test, wherein each testing circuit is configured to supply testing signals to terminals of the respective device under test, to subject the signals received from terminals of the respective device under test to testing, and to provide output signals indicative of whether the signals from the terminals are satisfactory;

an additional testing circuit that can be coupled simultaneously to additional terminals of multiple ones of the devices under test, wherein the additional testing circuit is configured to supply testing signals to the additional terminals, to subject signals received from the additional terminals to testing, and to provide output signals indicative of whether the signals from the additional terminals are satisfactory; and an arithmetic circuit configured to receive the output signals from each of the plurality of testing circuits and the additional testing circuit, and to provide a respective signal for each device under test indicative of whether that device under test is unsatisfactory based on the received output signals.

2. The apparatus of claim 1 wherein the arithmetic circuit is configured to classify the output signals received from the additional testing circuit according to the devices under test.

3. The apparatus of claim 2 wherein the arithmetic circuit is configured to logically combine output signals from a particular one of the plurality of testing circuits and corresponding output signals from the additional testing circuit, wherein the output signals that are logically combined together correspond to a particular one of the devices under test.

4. The apparatus of claim 1 wherein each of the plurality of testing circuits and the additional testing circuit includes comparators, wherein each comparator is configured to compare an output signal from a terminal of a device under test to a reference value.

5. A method of testing semiconductor devices comprising:

coupling fewer than all input/output terminals of a first device under test to a first test circuit and coupling fewer than all input/output terminals of a second device under test to a second test circuit;

coupling additional input/output terminals from the first and second devices under test to a third test circuit;

providing output signals respectively from the first and second test circuits indicative of whether signals from the terminals of the first and second devices, respectively, are satisfactory;

providing output signals from the third test circuit indicative of whether signals from the additional terminals are satisfactory; and logically combining the output signals from the first, second and third testing circuits to provide a respective signal for each device under test indicative of whether that device under test is unsatisfactory.

6. The method of claim 5 including classifying the output signals from the third testing circuit according to the devices under test.

7. The method of claim 6 including logically combining output signals from a particular one of the first and second testing circuits and corresponding output signals from the third testing circuit, wherein the output signals that are logically combined together correspond to a particular one of the devices under test.

8. The method of claim 5 including comparing signals from terminal of the devices under test to a reference value.

* * * * *